United States Patent
Jo et al.

(10) Patent No.: US 12,448,221 B2
(45) Date of Patent: Oct. 21, 2025

(54) TRANSFER SYSTEM AND CONTROL METHOD THEREOF

(71) Applicant: SEMES CO., LTD., Cheonan-si (KR)

(72) Inventors: In Su Jo, Cheonan-si (KR); Tae Uk Park, Cheonan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 165 days.

(21) Appl. No.: 18/340,569

(22) Filed: Jun. 23, 2023

(65) Prior Publication Data

US 2024/0059497 A1 Feb. 22, 2024

(30) Foreign Application Priority Data

Aug. 18, 2022 (KR) .................. 10-2022-0103606

(51) Int. Cl.
*B65G 43/02* (2006.01)
*H01L 21/67* (2006.01)
*H01L 21/677* (2006.01)

(52) U.S. Cl.
CPC ........ *B65G 43/02* (2013.01); *H01L 21/67259* (2013.01); *H01L 21/67715* (2013.01); *H01L 21/67733* (2013.01); *H01L 21/67736* (2013.01); *B65G 2201/0297* (2013.01); *B65G 2811/0678* (2013.01); *B65G 2812/99* (2013.01)

(58) Field of Classification Search
CPC ......... H01L 21/67259; H01L 21/67715; H01L 21/67733; H01L 21/67736; B65G 43/02
USPC ...................................................... 198/570
See application file for complete search history.

(56) References Cited

U.S. PATENT DOCUMENTS

| | | | | |
|---|---|---|---|---|
| 2009/0063052 A1* | 3/2009 | Onishi | ................. | G05D 1/0289 701/301 |
| 2011/0106341 A1* | 5/2011 | Kinoshita | ............ | G05D 1/0289 701/2 |
| 2017/0229333 A1* | 8/2017 | Kinugawa | ............. | B61L 25/025 |
| 2019/0071085 A1* | 3/2019 | Wada | ................. | B60W 30/143 |
| 2022/0342423 A1* | 10/2022 | Kono | .................... | B65G 37/02 |

FOREIGN PATENT DOCUMENTS

| | | | | |
|---|---|---|---|---|
| KR | 100592131 B1 | 6/2006 | | |
| KR | 20200072140 A | 6/2020 | | |
| KR | 102242360 B1 | 4/2021 | | |
| KR | 20210087212 A * | 7/2021 | ....... | H01L 21/67733 |

* cited by examiner

*Primary Examiner* — James R Bidwell
(74) *Attorney, Agent, or Firm* — Harness, Dickey & Pierce, P.L.C.

(57) ABSTRACT

A transfer system according to the present invention comprises a first travel rail including a first merging section; a second travel rail merging the first travel rail at a merging point and including a second merging section corresponding to the first merging section; a transfer/loading area defined in the second merging section and located upstream of the merging point; and a controller (OCS) for controlling an operation of at least one transfer vehicle moving along the first travel rail and the second travel rail, wherein a second transfer vehicle moves along the second travel rail and enters the transfer/loading area, the second transfer vehicle starts a transfer/loading operation in the transfer/loading area, the first transfer vehicle moves along the first travel rail and enters the first merging section, and the first transfer vehicle passes through the merging point before the second transfer vehicle.

16 Claims, 4 Drawing Sheets

TRANSFER SYSTEM AND CONTROL METHOD THEREOF

This application claims the benefit of Korean Patent Application No. 10-2022-0103606, filed on Aug. 18, 2022, in the Korean Intellectual Property Office, the disclosure of which is incorporated herein by reference in its entirety.

BACKGROUND

1. Field

The present invention relates to a transfer system and a control method thereof.

2. Description of the Related Art

A wafer may be manufactured through various processes in a clean room equipped with a semiconductor device manufacturing line. The wafer manufactured in this way may be accommodated in a FOUP (Front Opening Unified Pod) and transferred through an unmanned transfer system. The unmanned transfer system may include a transfer vehicle (e.g., Overhead Hoist Transport (OHT), Rail Guided Vehicle (RGV), etc.) configured to be movable along a travel rail installed on a ceiling or floor of a clean room. These rails can branch or merge as needed.

SUMMARY

In order to prevent collisions between transfer vehicles at a place where travel rails merge (hereafter referred to as a merging point), only one transfer vehicle may be allowed to enter. That is, when there is a vehicle that has pre-entered a merging section by setting a section upstream of the merging point on the travel rail (hereinafter referred to as the merging section), transfer vehicles of other travel rails cannot pass until the vehicle passes through the merging point.

This means that when a transfer vehicle that entered first occupies the merging point for transfer/loading, the transfer vehicle on the opposite rail cannot pass and should wait. This may cause section congestion and overall transfer congestion, and reduce transfer amount.

The problem to be solved by the present invention is to provide a transfer system capable of reducing transfer congestion and increasing the transfer amount.

Another problem to be solved by the present invention is to provide a control method of a transfer system capable of reducing transfer congestion and increasing a transfer amount.

The problems of the present invention are not limited to the problems mentioned above, and other problems not mentioned will be clearly understood by those skilled in the art from the following description.

One aspect of the transfer system of the present invention for achieving the above object may comprise a first travel rail including a first merging section; a second travel rail merging the first travel rail at a merging point and including a second merging section corresponding to the first merging section; a transfer/loading area defined in the second merging section and located upstream of the merging point; and a controller (OCS) for controlling an operation of at least one transfer vehicle moving along the first travel rail and the second travel rail.

One aspect of the control method of the transfer system of the present invention for achieving the other object may comprise providing a transfer system including a first travel rail including a first merging section, a second travel rail merging the first travel rail at a merging point and including a second merging section corresponding to the first merging section, and a transfer/loading area defined in the second merging section and located upstream of the merging point; moving along the second travel rail and entering the transfer/loading area by a second transfer vehicle; subsequently, starting a transfer/loading operation in the transfer/loading area by the second transfer vehicle; subsequently, moving along the first travel rail and entering the first merging section by the first transfer vehicle; and subsequently, passing through the merging point by the first transfer vehicle before the second transfer vehicle.

Details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
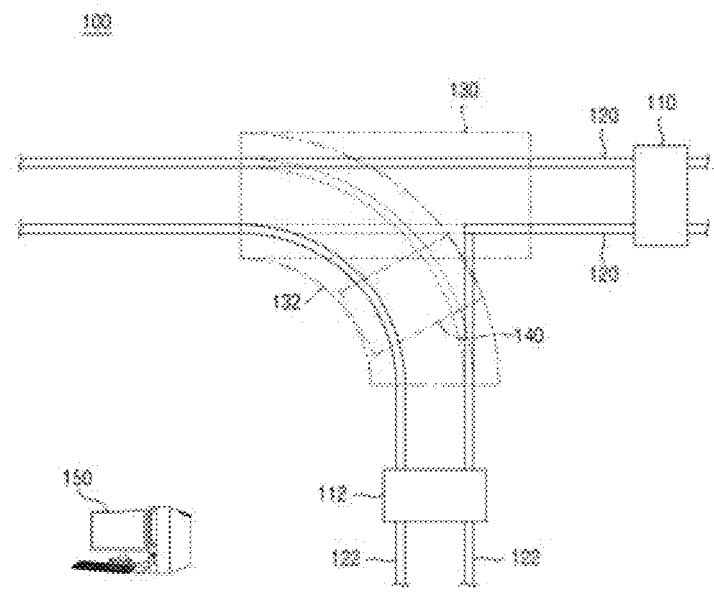
FIG. 1 is an exemplary view showing a situation before first and second transfer vehicles enter first and second merging sections.

Hereinafter, preferred embodiments of the present invention will be described in detail with reference to the accompanying drawings. Advantages and features of the present invention, and methods for achieving them will become clear with reference to the following detailed embodiments in conjunction with the accompanying drawings. However, the present invention may be embodied in different forms without being limited to the embodiments described below. The embodiments are provided to complete the disclosure of the present invention and to fully inform those skilled in the art of the scope of the invention to which the present invention belongs, and the present invention is defined by the scope of the claims. Also, like reference numerals throughout the specification denote like elements.

The spatially relative terms "below," "beneath," "lower," "above," and "upper" can be used to easily describe the correlation between elements or components and other elements or components. Spatially relative terms should be understood as encompassing different orientations of elements in use or operation in addition to the orientations shown in the figures. For example, when flipping elements shown in the figures, elements described as "below" or "beneath" other elements may be placed "above" the other elements. Thus, the exemplary term "below" may include directions of both below and above. Elements may also be oriented in other orientations, and thus spatially relative terms may be interpreted according to orientation.

Although first, second, etc. are used to describe various elements, components and/or sections, these elements, components and/or sections are not limited by these terms. These terms are only used to distinguish one element, component or section from another element, component or section. Accordingly, the first element, first component, or first section referred to below may also be a second element, second component, or second section within the spirit of the present invention.

Terminology used herein is for describing the embodiments and is not intended to limit the present invention. In this specification, singular forms also include plural forms unless specifically stated otherwise in a phrase. As used herein, "comprises" and/or "comprising" means that a stated component, step, operation, and/or element do not exclude the presence or addition of one or more other components, steps, operations, and/or elements.

Unless otherwise defined, all terms (including technical and scientific terms) used in this specification may be used in a meaning commonly understood by those of ordinary skill in the art to which the present invention belongs. In addition, terms defined in commonly used dictionaries are not interpreted ideally or excessively unless explicitly specifically defined.

Hereinafter, embodiments of the present invention will be described in detail with reference to the accompanying drawings. In the description with reference to the accompanying drawings, the same or corresponding components regardless of reference numerals are given the same reference numerals, and a redundant description related to this is omitted.

In the present invention, in FIG. 1, it is defined that the lower travel rail is the first travel rail 120 and the transfer vehicle traveling on the first travel rail is the first transfer vehicle 110, and the travel rail located in the form of the straight section before merging the first travel rail 120 is the second travel rail 122 and the transfer vehicle traveling on the second travel rail is the second transfer vehicle 112, and the sections including the merging point of the first travel rail 120 and the second travel rail 122 and the upstream of the merging point are the first merging section 130 and the second merging section 132.

FIG. 1 is a conceptual diagram for describing a transfer system according to an embodiment of the present invention.

According to FIG. 1, the transfer system 100 may include transfer vehicles 110 and 112, travel rails 120 and 122 and a controller 150.

Among these, the transfer vehicles 110 and 112 that transfer articles will be described first.

The purpose of the transfer vehicles 110 and 112 is to transfer the wafer-accommodated article to its destination. The transfer vehicles 110 and 112 may transfer articles to various facilities where a semiconductor device manufacturing process is performed in a clean room.

Such transfer vehicles 110 and 112 may be implemented as, for example, an Overhead Hoist Transport (OHT).

When the transfer vehicles 110 and 112 are implemented as an OHT, driving force is generated by a driving motor (not shown) and the generated driving force is transmitted to driving wheels (not shown) through a driving shaft. Using this driving force, the transfer vehicles 110 and 112 may travel on the travel rails 120 and 122 to transfer articles.

Next, the travel rails 120 and 122 will be described. The travel rails 120 and 122 provide a path through which the transfer vehicles 110 and 112 can move. The travel rails 120 and 122 may be installed on a ceiling of a clean room, in which a manufacturing line for manufacturing semiconductor devices (e.g., wafers) is provided.

The travel rails 120 and 122 may be formed by mixing various types of sections, such as a straight section, a curved section, an inclined section, and a branching section, depending on the layout in the clean room. However, it is not limited thereto. The travel rails 120 and 122 may also be formed with only a single section (e.g., a straight section).

Next, the transfer/loading area 140 will be described. The transfer/loading area 140 is located upstream of the merging point where the travel rails 120 and 122 merge. In addition, the transfer/loading area 140 is defined in the second merging section 132 and may be located on the second travel rail 122.

The transfer/loading area 140 is a section for transferring/loading of unloaded transfer vehicles. An unloaded transfer vehicle may stop for transfer/loading in the transfer/loading area 140, stop for other reasons such as failure or inspection, or pass through, but is not limited thereto. When an unloaded transfer vehicle enters the transfer/loading area 140, the transfer vehicle stops traveling in the area and starts transfer/loading of the articles. When the transfer/loading is completed, the transfer vehicle resumes traveling again.

The controller 150 may instruct transfer vehicles 110 and 112 to enter, detour, pass and stop. The controller 150 also controls movement of the transfer vehicles 110 and 112 of the transfer system 110. However, the present invention is not limited thereto. The transfer vehicles 110 and 112 are connected to the controller 150 by wire, and it is also possible to determine movement from the controller 150 through a wired signal. The controller 150 may be implemented as a computer equipped with a processor having an arithmetic function.

When the controller 150 generates a transfer/loading command according to the occurrence of a job, the controller 150 allocates a traveling route and a job of the transfer vehicle in consideration of the state of the entire transfer vehicles (e.g., work available state, current location, etc.) so that the entire transfer vehicles perform the job smoothly.

It will be described with reference to FIG. 1 again.

In one embodiment, the first transfer vehicle 110 and the second transfer vehicle 112 travel on the first travel rail 120 and the second travel rail 122, respectively. In addition, the first transfer vehicle 110 is a vehicle that has been transferred and loaded, and the second transfer vehicle 112 is a vehicle that has not been transferred and loaded.

FIG. 1 is a situation before each transfer vehicle enters a merging section. Each transfer vehicle is traveling upstream of the merging section, and the transfer/loading situation of each transfer vehicle is as described above.

Next, the merging sections 130 and 132 will be described.

The merging sections 130 and 132 are sections set by the respective travel rails 120 and 122 when two or more travel rails 120 and 122 merge. This can be set including the point where each travel rail merges. The merging sections 130 and 132 include a point where each travel rail merges and a section upstream of the point.

In addition, even if the first merging section 130, the second merging section 132, and the transfer/loading area 140 are not shown in FIGS. 2 to 5, it does not mean that they do not exist, but means that they are simply omitted.

FIGS. 2 to 5 are intermediate diagrams for describing a control method of a transfer system according to an embodiment of the present invention.

Figure 2:
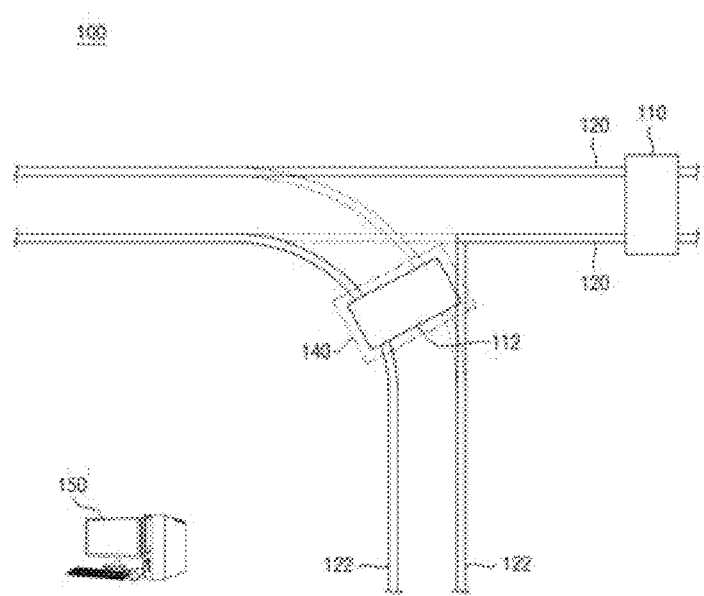
FIG. 2 is an exemplary view showing that a second transfer vehicle entered and is located in a transfer/loading area for transfer/loading.

First of all, referring to FIG. 2, when the controller 150 requests/instructs transfer/loading, an unloaded second transport vehicle 112 enters the transfer/loading area 140 for transfer/loading. Even if the second transfer vehicle 112 is a loaded vehicle or an unloaded vehicle, when the user does not request transfer/loading in the corresponding area, the vehicle that first entered the merging section 130 and 132 passes first. However, when the user requests transfer/loading, the unloaded second transfer vehicle 112 stops in the transfer/loading area 140. The controller 150 changes the second merging section 132 to an unoccupied state while transferring/lading in the transfer/loading area 140.

Figure 3:
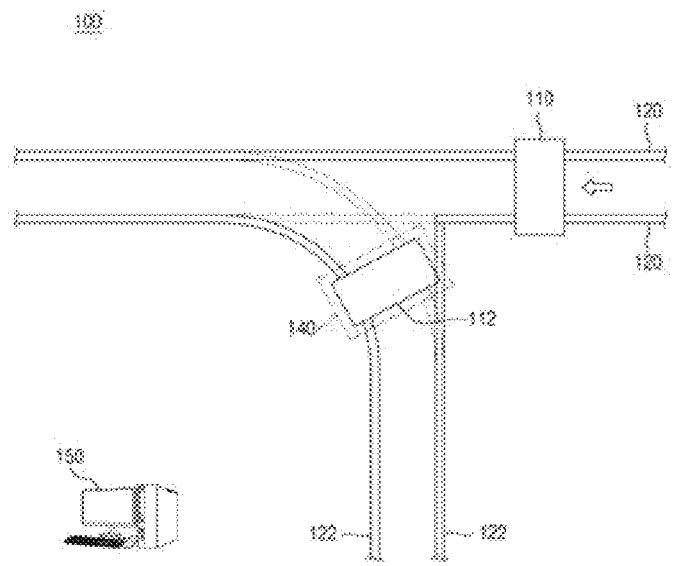
FIG. 3 is an exemplary view showing that the first transfer vehicle entered the merging section later than the second transfer vehicle.

Referring to FIG. 3, the second transfer vehicle 112 starts a transfer/loading operation in the transfer/loading area 140, and the first transfer vehicle 110 moves along the first travel rail 120 and enters the first merging section 130.

This indicates that the first transfer vehicle 110 entered the merging sections 130 and 132 later than the second transfer vehicle 112. At this time, the controller 150 checks whether the second merging section 132 is occupied, and if the second merging section 132 is not occupied, instructs the first transfer vehicle 110 to pass through the merging point.

Figure 4:
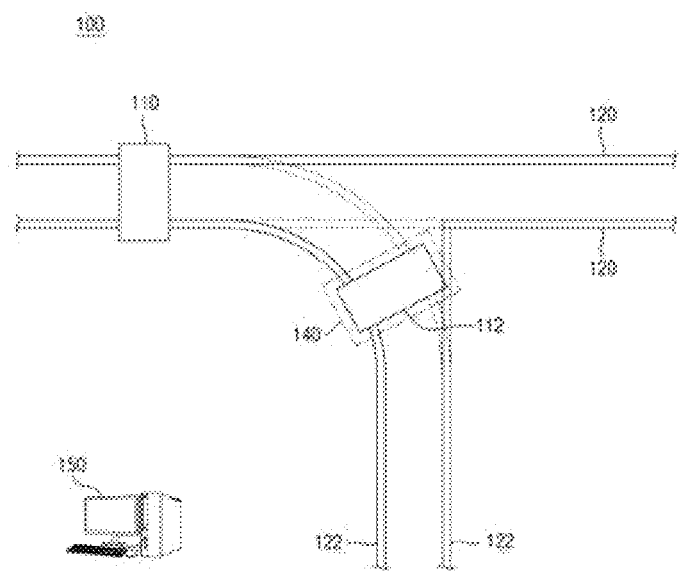
FIG. 4 is an exemplary view showing that the first transfer vehicle first passes through the merging point as the second transfer vehicle is processed as an unoccupied state.

Referring to FIG. 4, the first transfer vehicle 110 passes through the merging point before the second transfer vehicle 112. This indicates that the traveling of the transfer vehicles 110 and 112 is controlled according to the occupied state of the merging sections 130 and 132.

Figure 5:
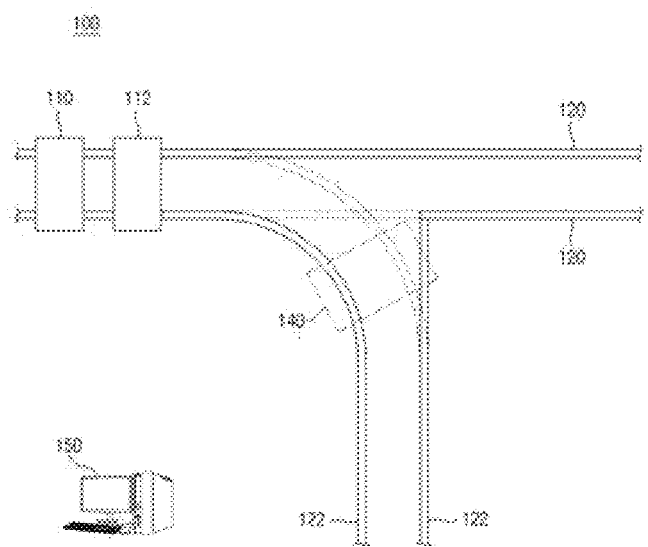
FIG. 5 is an exemplary view showing that a second transfer vehicle that has completed transfer/loading later passes through the merging point.

Referring to FIG. 5, the first transfer vehicle 110 passes through the merging point. In the transfer/loading area 140, the transfer/loading operation of the second transfer vehicle 112 ends, and the controller 150 changes the second merging section 132 to an occupied state. When the second merging section 132 is changed to an occupied state, the second transfer vehicle 112 whose transfer/loading operation ends passes through the second merging section 132 and continues to travel in the traveling direction. In this way, the transfer system 100 allows the first transfer vehicle 110 to pass through the merging point before the second transfer vehicle 112, thereby reducing the waiting time of the first transfer vehicle 110, reducing congestion in the section, and increasing the transfer amount.

Figure 6:
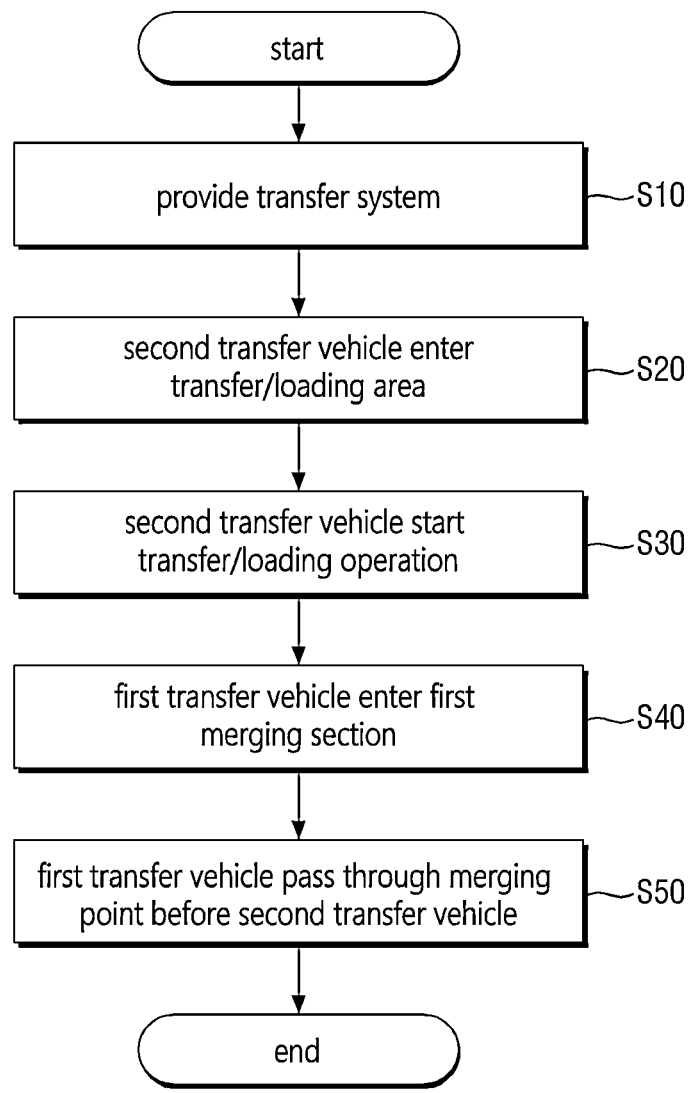
FIG. 6 is a flow chart schematically showing the transfer system according to FIGS. 1 to 5.

FIG. 6 is a flow chart schematically showing the transfer system according to FIGS. 1 to 5.

FIG. 6 provides the transfer system 100 according to the present invention (S10), and when the second transfer vehicle 112 enters the transfer/loading area 140 for transfer/loading (S20), the second transfer vehicle 112 performs transfer/loading and the second transfer vehicle 112 is recognized as an unoccupied state during the transfer/loading operation (S30), and the first transfer vehicle 110 enters the first merging section 130 later (S40), and the first transfer vehicle 110 passes through the merging point before the second transfer vehicle 112 (S50), thereby significantly reducing the waiting time for the merging point of the transfer vehicle.

Although the embodiments of the present invention have been described with reference to the above and accompanying drawings, those skilled in the art to which the present invention pertains can understand that the present invention can be practiced in other specific forms without changing the technical spirit or essential features. Therefore, the embodiments described above should be understood as illustrative in all respects and not limiting.

What is claimed is:

1. A transfer system comprising:
    a first travel rail including a first merging section;
    a second travel rail merging the first travel rail at a merging point and including a second merging section overlapping with the first merging section;
    a transfer/loading area defined in the second merging section and located upstream of the merging point; and
    a controller configured to control an operation of at least one transfer vehicle moving along the first travel rail and the second travel rail,
    wherein the transfer system is configured to accommodate a second transfer vehicle moving along the second travel rail and entering the transfer/loading area,
    the transfer system is configured to subsequently accommodate, the second transfer vehicle starting a transfer/loading operation in the transfer/loading area,
    the transfer system is configured to subsequently accommodate a first transfer vehicle moving along the first travel rail and entering the first merging section, and
    the transfer system is configured to subsequently accommodate the first transfer vehicle passing through the merging point before the second transfer vehicle.

2. The transfer system of claim 1, wherein between moving along the second travel rail and entering the transfer/loading area by the second transfer vehicle, and starting the transfer/loading operation in the transfer/loading area by the second transfer vehicle, in response to the second transfer vehicle being an unloaded vehicle and a vehicle that has received a loading instruction in the transfer/loading area, the controller is configured to process the second merging section as an unoccupied state.

3. The transfer system of claim 2, wherein, between moving along the first travel rail and entering the first merging section by the first transfer vehicle, and passing through the merging point by the first transfer vehicle before the second transfer vehicle, the controller is configured to instruct the first transfer vehicle to pass through the merging point in response to the second merging section being unoccupied state after checking whether the second merging section is occupied.

4. The transfer system of claim 2, wherein the system is configured to operate such that the transfer/loading operation of the second transfer vehicle ends in the transfer/loading area and to change the second merging section to an occupied state.

5. The transfer system of claim 2, wherein the case, in which the controller processes the second merging section as an unoccupied state, further includes a case of at least one of a failure or an inspection in response to the second transfer vehicle entering the transfer/loading area.

6. The transfer system of claim 1, wherein the transfer/loading area is defined as being located downstream of the merging point.

7. The transfer system of claim 1, wherein the transfer/loading area is in a curved portion of the second travel rail.

8. The transfer system of claim 1, wherein the first and second travel rails are overhead travel rails.

9. The transfer system of claim 1, wherein the transfer/loading operation includes transferring a Front Opening Unified Pod (FOUP).

10. The transfer system of claim 1, wherein the first merging section is straight.

11. The transfer system of claim 1, wherein the first and second transfer vehicles are Overhead Hoist Transport vehicles.

12. The transfer system of claim 1, wherein the first and second transfer vehicles are Rail Guide vehicles.

13. The transfer system of claim 1, wherein the second merging section is curved.

14. A method for controlling a transfer system comprising:
- providing a transfer system including a first travel rail including a first merging section, a second travel rail merging the first travel rail at a merging point and including a second merging section corresponding to the first merging section, and a transfer/loading area defined in the second merging section and located upstream of the merging point;
- moving a second transfer vehicle along the second travel rail and having the second transfer vehicle enter the transfer/loading area;
- subsequently, having the second transfer vehicle start a transfer/loading operation in the transfer/loading area;
- subsequently, having a first transfer vehicle move along the first travel rail and enter the first merging section; and
- subsequently, having the first transfer vehicle pass through the merging point before the second transfer vehicle.

15. The method of claim 14, wherein, between moving along the second travel rail and entering the transfer/loading area by the second transfer vehicle, and starting the transfer/loading operation in the transfer/loading area by the second transfer vehicle, in response to the second transfer vehicle being an unloaded vehicle and a vehicle that has received a loading instruction in the transfer/loading area, a controller processes the second merging section as an unoccupied state.

16. The method of claim 15, wherein, between moving along the first travel rail and entering the first merging section by the first transfer vehicle, and passing through the merging point by the first transfer vehicle before the second transfer vehicle, the controller instructs the first transfer vehicle to pass through the merging point in response to the second merging section being unoccupied state after checking whether the second merging section is occupied, and the transfer/loading operation of the second transfer vehicle ends in the transfer/loading area, and the controller changes the second merging section to an occupied state.

* * * * *